United States Patent
Sharma (10) Patent No.: US 6,699,772 B1
(45) Date of Patent: Mar. 2, 2004

(54) HYBRID TRENCH ISOLATION TECHNOLOGY FOR HIGH VOLTAGE ISOLATION USING THIN FIELD OXIDE IN A SEMICONDUCTOR PROCESS

(76) Inventor: Gian Sharma, 3377 Shadow Leaf Dr., San Jose, CA (US) 95132

( * ) Notice: Subject to any disclaimer, the term of this patent is extended or adjusted under 35 U.S.C. 154(b) by 33 days.

(21) Appl. No.: 10/246,882

(22) Filed: Sep. 18, 2002

(51) Int. Cl.[7] .................... H01L 21/8242; H01L 21/76
(52) U.S. Cl. .................... 438/424; 438/243; 438/245; 438/425; 438/426; 438/430
(58) Field of Search .................. 438/424, 243, 438/245, 425, 426, 430

(56) References Cited

U.S. PATENT DOCUMENTS

| | | | | |
|---|---|---|---|---|
| 5,004,703 A | * | 4/1991 | Zdebel et al. ............ | 438/413 |
| 5,096,848 A | * | 3/1992 | Kawamura .............. | 438/425 |
| 5,308,784 A | * | 5/1994 | Kim et al. ............... | 438/427 |
| 5,372,968 A | * | 12/1994 | Lur et al. ................ | 438/425 |
| 5,821,160 A | * | 10/1998 | Rodriguez et al. ....... | 438/601 |
| 5,866,466 A | * | 2/1999 | Kim et al. ............... | 438/426 |
| 6,316,807 B1 | * | 11/2001 | Fujishima et al. ........ | 257/333 |
| 6,362,117 B1 | | 3/2002 | Houston | |
| 6,365,451 B2 | | 4/2002 | Havemann | |
| 6,413,802 B1 | | 7/2002 | Hu et al. | |
| 6,423,475 B1 | | 7/2002 | Lyons et al. | |
| 6,429,125 B2 | | 8/2002 | Reinberg | |

* cited by examiner

*Primary Examiner*—John F. Niebling
*Assistant Examiner*—Stanetta Isaac
(74) *Attorney, Agent, or Firm*—Gray, Cary Ware & Friedenrich LLP (57) ABSTRACT

A method for creating a trench for high voltage isolation begins by forming a trench in the substrate having sidewalls and a bottom surface. Spacers are formed along the sidewalls of a trench with the spacers partially covering the bottom surface. A barrier layer is formed on the portion of the bottom surface not covered by the spacers. The spacers are then removed, exposing the bottom surface not covered by the barrier layer. The bottom surface is then further etched to create a second deeper trench which has sidewalls and bottom surface. An insulating layer is then conformally deposited to cover the surface of the substrate including filling the first and second trenches.

20 Claims, 11 Drawing Sheets

HYBRID TRENCH ISOLATION TECHNOLOGY FOR HIGH VOLTAGE ISOLATION USING THIN FIELD OXIDE IN A SEMICONDUCTOR PROCESS

CROSS REFERENCE TO RELATED APPLICATIONS

This application is related to U.S. patent application Ser. No. 10/247,400, filed on even date herewith, entitled "A Method for Forming A Trench For High Voltage Isolation In a Semiconductor Process", inventor Gian Sharma, the disclosure of which is incorporated herein by reference.

TECHNICAL FIELD

The present invention relates to a method of forming a trench for high voltage isolation in a semiconductor substrate.

BACKGROUND OF THE INVENTION

Methods of forming a lithographic opening in a layer of a material in a semiconductor process are well known in the art. A lithographic opening is the smallest feature size in a semiconductor process that the particular process can produce. Thus, for example, in a 0.13 micron process, the smallest opening or feature size that the process can create would be an opening of 0.13 micron in size, which would be the lithographic feature for that process. A sublithographic opening would be an opening having dimensions that are smaller than the smallest feature size available for that lithographic process. Thus, any opening having a dimension less than 0.13 micron in a 0.13 micron process would be a sublithographic opening in a 0.13 micron process.

It is desirable in a lithographic process to form sublithographic openings in certain parts of the semiconductor structure to create a smaller feature size in order to handle problems such as misalignment or the like. In the prior art, it is known to create a sacrificial layer of a first material. A lithographic opening is created in the first layer of sacrificial material forming a lithographic opening therein. A second layer of a second material, different from the first material, is conformally deposited on the first layer. The second layer of the second material is then anisotropically etched until the first layer is reached. This creates spacers made of the second material in the opening in the first layer. The spacers in the opening of the first layer decreases the size of the opening thereby creating a sublithographic opening. The first layer of the first material along with the spacers of the second material is then used as a masking layer to create sublithographic openings in the layers upon which the first layer is deposited. See for example, U.S. Pat. No. 6,362,117. Such a process, however, requires the use of two layers of different materials to form a sacrificial masking layer. See also U.S. Pat. Nos. 6,365,451; 6,413,802; 6,429,125 and 6,423,475 on creation of sublithographic structures in a semiconductor structure.

Methods for forming trenches for isolation are also well known in the art. However, as the scale of integration increases, i.e., the size of the lithographic opening decreases, voltages used in applications involving high voltages such as non-volatile memory cell increases. Thus, the trenches that are needed to isolate higher voltage elements of the integrated circuits used in such applications need to be wider and deeper. Wider and deeper trenches which are used to support higher breakdown and higher isolation voltages than the prior art create problems in that as the trenches are filled with insulating materials which are much thicker than normal, the contour of the surface of the semiconductor becomes more ragged and thereby rendering more difficult to planarize the surface using conventional planarization techniques such as CMP polishing techniques. Since thicker insulating films required for deeper trench isolations is accompanied by larger variations of thickness compared to normal thickness, this makes the planarization process even more difficult to achieve. Therefore, it is desirable to form trenches for high voltage isolation which have less contour deviations on the surface than the prior art in order that subsequent planarization steps may be more effective.

SUMMARY OF THE INVENTION

The present invention relates to a method of creating a trench for high voltage isolation in a semiconductor substrate that has a first surface. A first trench is formed in the substrate. The first trench has sidewalls and a bottom surface with the first trench having a first width and a first depth. Spacers are formed along the sidewalls of the first trench with the spacers partially covering the bottom surface. A barrier layer is formed on portions of the bottom surface not covered by the spacers. The spacers are removed thereby exposing portions of the bottom surface not covered by the barrier layer. The bottom surface is etched in portions that are not covered by the barrier layer to form a second trench having sidewalls and a bottom surface. The second trench has a second depth. An insulating layer is conformally deposited on the first surface including filling the first and second trenches.

DETAILED DESCRIPTION OF THE INVENTION

Figure 1A:
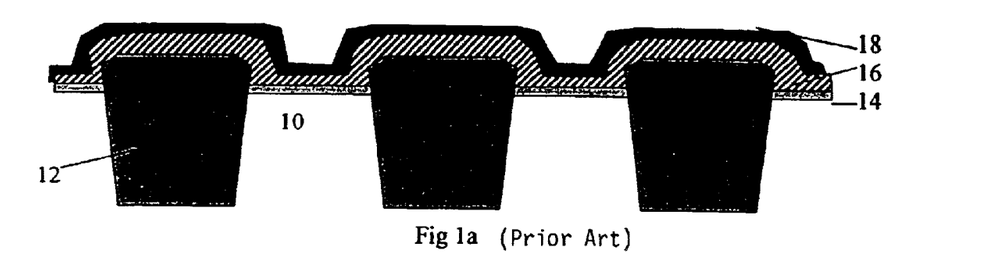
FIGS. 1a–1g are cross-sectional views of a method to form a sublithographic opening in a first layer of a first material in a semiconductor process.

Referring to FIG. 1a, there is shown a cross-sectional view of a semiconductor substrate 10, made typically of single crystalline silicon. The substrate 10 has a number of shallow trench isolations 12 provided therein. The process of forming sublithographic openings will be described with regard to FIGS. 1a–1g which shows the formation of a floating gate over the substrate 10.

A first layer of silicon oxide or silicon dioxide 14 (on the order of 50 angstroms) is formed on a first surface (top surface) of the substrate 10. This can be done, for example, by either Chemical Vapor Deposition or by thermally converting the Silicon to Silicon Dioxide. Eventually, the layer 14 of silicon (di)oxide (as used hereinafter (di)oxide shall refer to both silicon oxide as well as silicon dioxide) serves as the gate coupling oxide. A first layer 16 of polysilicon or amorphous silicon 16 (on the order of 600 angstroms) is deposited on the layer 14 of silicon (di)oxide. This can be done, for example, by plasma enhance deposition method or by high temperature method where compounds of silicon are reduced to silicon. As used hereinafter, Polysilicon will refer to both amorphous silicon as well as polysilicon. Finally, a layer of silicon nitride 18 (on the order of 300 angstroms) is conformally deposited on the first layer 16 of Polysilicon. This can be done, for example, by plasma enhanced deposition method or by high temperature method where compounds of silicon, such as $SiH_4$, $SiH_2Cl_2$ and other gases like $NH_3$ are used to form the layer 18 of silicon nitride. All of the foregoing deposition processes are well known in the art. The resultant structure is shown in FIG. 1a.

Figure 1B:
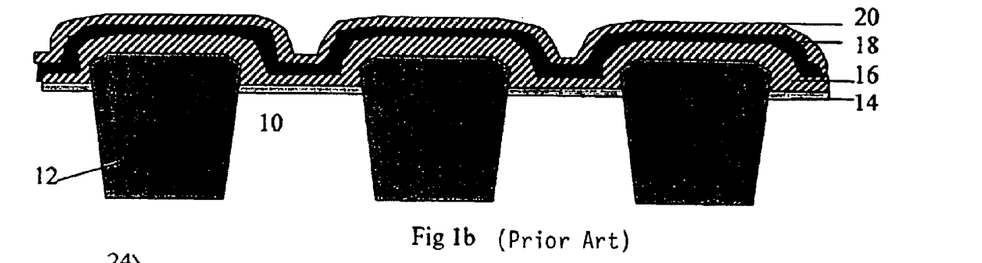

A second layer of Polysilicon 20 (on the order of 450 angstroms) is then deposited on the structure shown in FIG. 1a, on top of the layer 18 of silicon nitride. The resultant structure is shown in FIG. 1b. The second layer 20 of Polysilicon can be deposited by conventional well-known techniques such as reduction of gaseous compounds of silicon.

Photoresist 22 is then applied across the structure of FIG. 1b and lithographic openings 24 are formed therein. The lithographic openings 24 are formed in locations where ultimately the sublithographic openings in the first layer 16 of Polysilicon will be formed. Using well known photoresist exposure and removal techniques, lithographic openings 24 are formed. The resultant structure is formed in FIG. 1c.

Using the photoresist 22 as the mask, the exposed second layer of Polysilicon 20 in the openings 24 are then removed using well known techniques such as RIE anisotropic etch with silicon nitride as the etch stop. The anisotropic etching of the second layer 20 of Polysilicon proceeds until the layer 18 of silicon nitride is exposed. The resultant structure is shown in FIG. 1d.

The photoresist 22 is then removed. This results in the second layer of Polysilicon 20 having the lithographic openings 24. This resultant structure is shown in FIG. 1e.

Figure 1C:
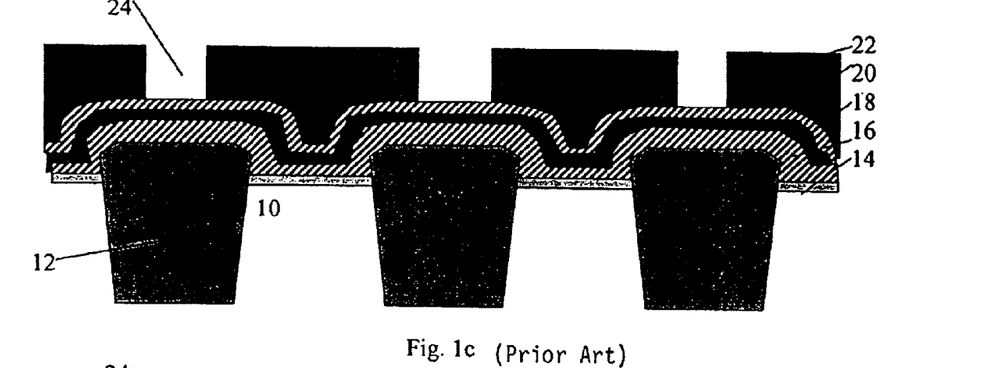
Figure 1D:
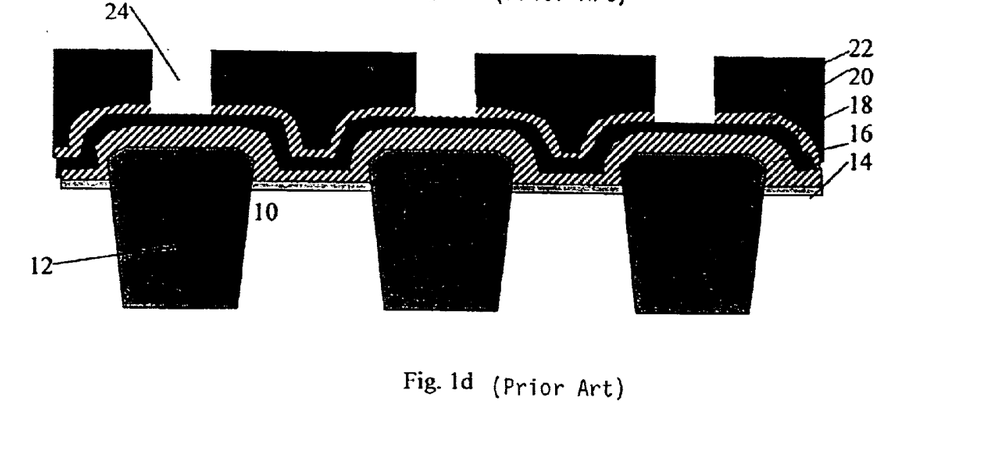
Figure 1E:
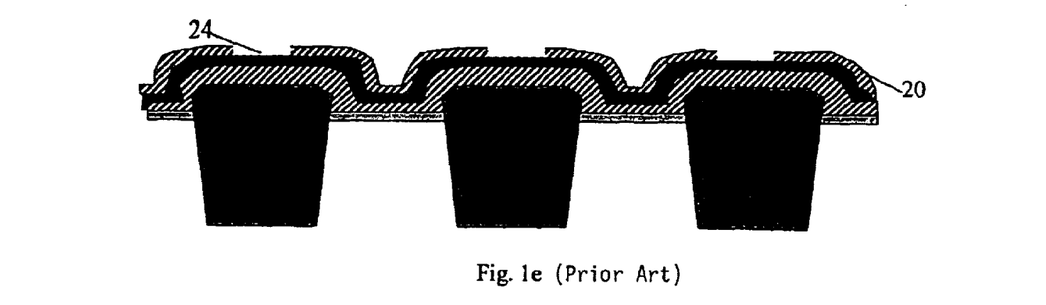
Figure 1F:
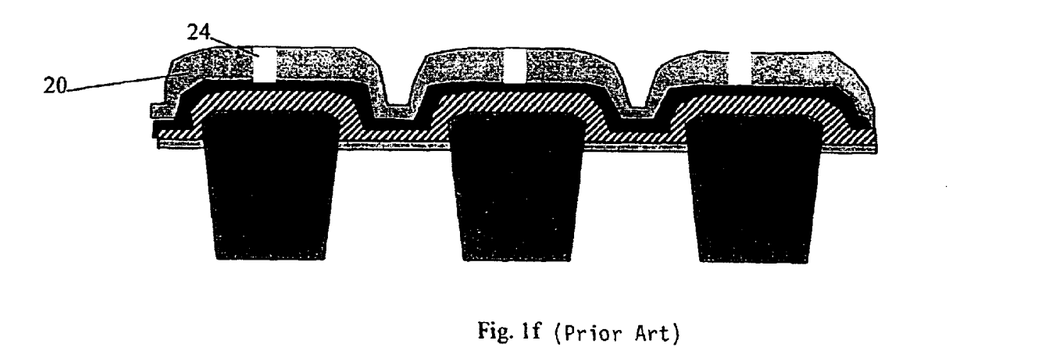

The structure shown in FIG. 1e is then oxidized or placed in an oxidizing atmosphere such as $O_2$ alone or a mixture of $H_2$ and $O_2$. This causes the second layer 20 of Polysilicon to be converted into silicon (di)oxide. As is well known, since silicon (di)oxide has larger molecular size than Polysilicon, the conversion of Polysilicon 20 into silicon (di)oxide causes the spacing or the opening 24 to shrink. This is due to the lateral expansion of the silicon (di)oxide when it is formed. As a result, a sublithographic opening is then created. The resultant structure is shown in FIG. 1f.

Figure 1G:
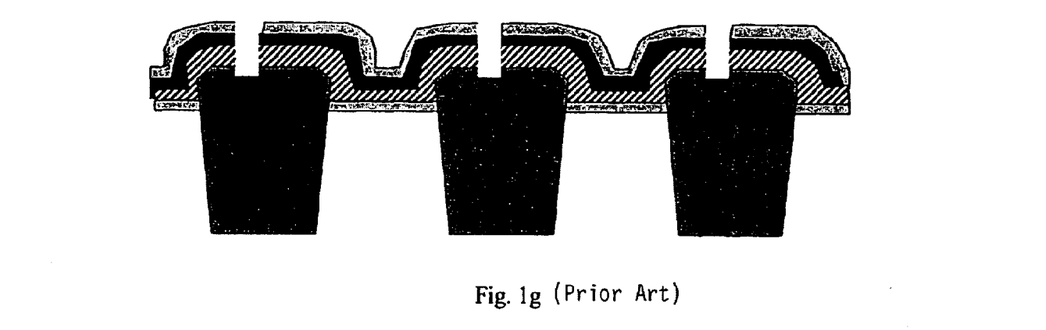

Using the silicon (di)oxide layer 20 as the masking layer, the layer 18 of silicon nitride and the layer 16 of Polysilicon is then etched using anisotropic etching. The resultant structure is shown in FIG. 1g in which sublithographic openings are created in the layer 18 of silicon nitride and the layer 16 of Polysilicon. The resultant structure is shown in FIG. 1g.

Thereafter, the masking layer of silicon (di)oxide 20 can be removed as well as the silicon nitride layer 18 can be removed, resulting in the first layer 16 of Polysilicon with sublithographic openings 24.

Figure 2A:
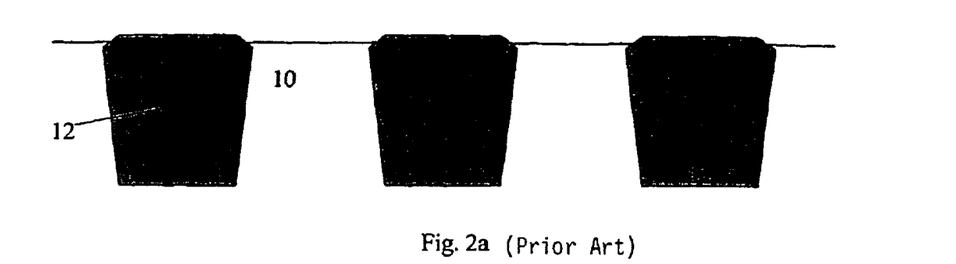
FIGS. 2a–2f are cross-sectional views of another method to form a sublithographic opening in a first layer of a first material in a semiconductor process.

Referring to FIG. 2a, there is shown a cross-sectional view of the first step in another method of creating a sublithographic opening in a material in a semiconductor process. Similar to the cross-sectional view shown in FIG. 1a, the process begins with a semiconductor substrate of single crystalline silicon 10 with trench isolations 12. Again, however, the use of trench isolations 12 is only for illustration purposes as the FIGS. 2a–2f show the process of creating a floating gate of Polysilicon in a structure overlying shallow trench isolation 12 regions. However, the method of present invention is not so limited and can be used to create sublithographic openings in any material in a semiconductor process for any purpose.

A first layer of silicon (di)oxide 14 is then deposited on the surface of the substrate 10. This can be a layer on the order of 50 angstroms and can be made by well known conventional techniques such as chemical vapor deposition or high temperature thermal deposition. The resultant structure is shown in FIG. 2b.

Figure 2B:
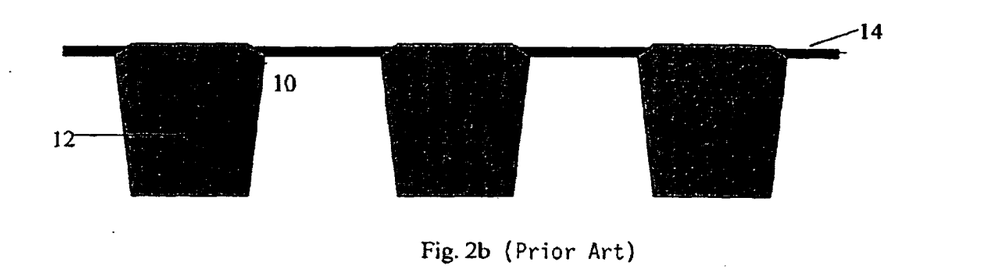
Figure 2C:
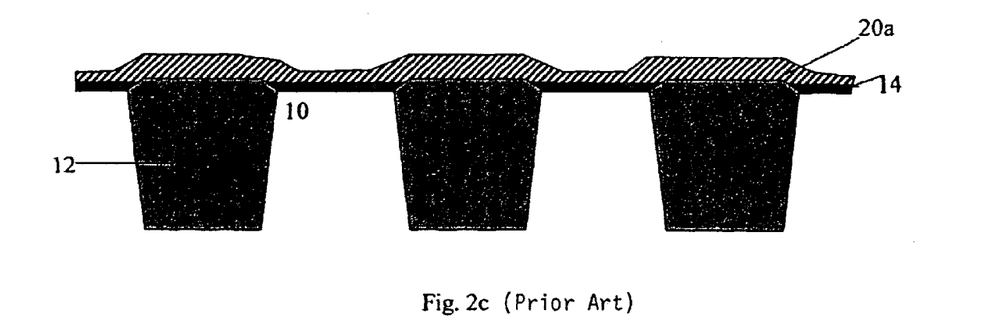

A first layer 20a of Polysilicon is then conformally deposited over the contour of the structure shown in FIG. 2b. The first layer of Polysilicon 20a can be deposited by conventional techniques such as chemical Vapor Deposition and may be deposited to a thickness of 1000 angstroms. The resultant structure is shown in FIG. 2c.

Figure 2D:
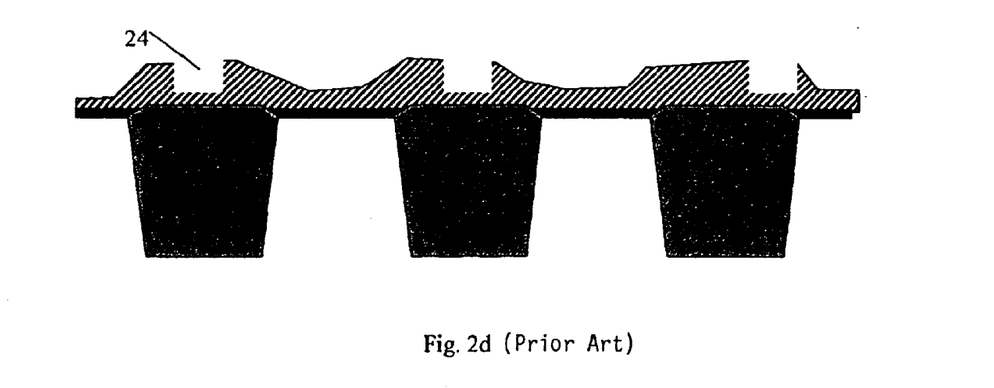

Using conventional photoresist 22 (as shown in FIGS. 1c and 1d), a lithographic opening 24 is created in the first layer 20a of Polysilicon. However, the first layer of Polysilicon 20a is not completely removed or etched from the lithographic opening 24. In the preferred embodiment, about 90% of the thickness of the Polysilicon 20a is removed from the opening 24. The process of creating a lithographic opening 24 in the first Polysilicon layer 20a results in residual Polysilicon in the lithographic opening 24, as shown in FIG. 2d.

Figure 2E:
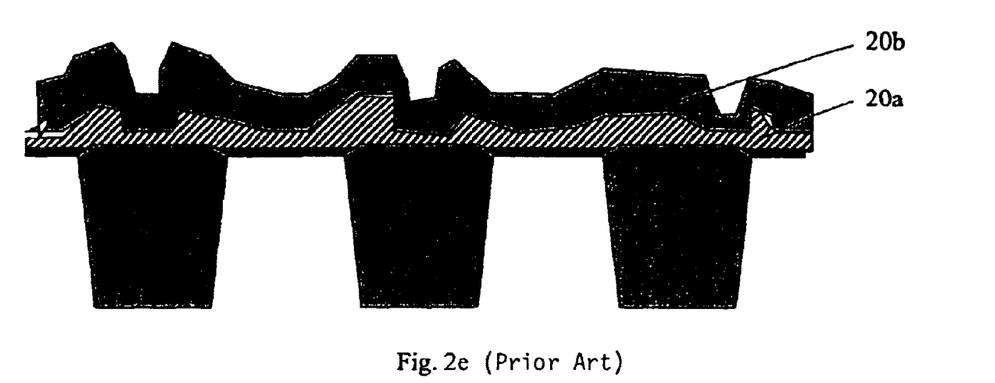
Figure 2F:
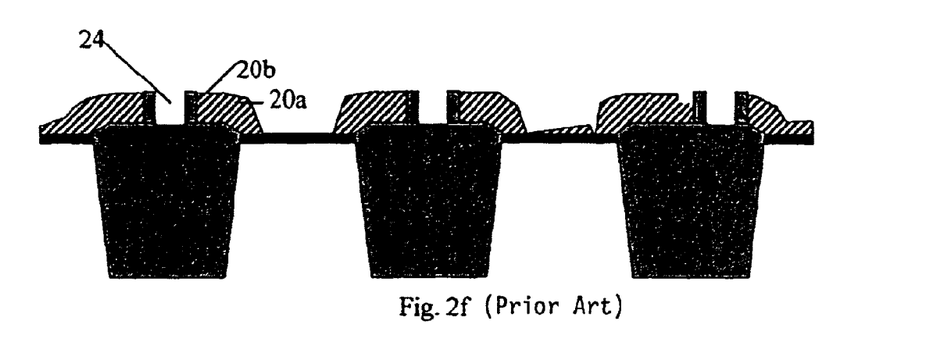

A second layer 20b of Polysilicon, which is the same material as the first layer 20a, is then conformally deposited to the contour of the first layer 20a of Polysilicon. The second layer 20b of Polysilicon is on the order of 450 angstroms and may be deposited by Chemical Vapor Deposition. The result of the deposition process is the structure shown in FIG. 2e. Thereafter, the structure shown in FIG. 2e is anisotropically etched until all of the Polysilicon is etched from the opening 24. This etching process causes the removal of the Polysilicon 20a as well as the Polysilicon from the second layer 20b that were deposited in the lithographic opening 24. However, an amount of Polysilicon 20b continues to line the sidewalls of the opening 24 to create a sublithographic opening 24. The resultant structure is shown in FIG. 2f.

Figure 3A:
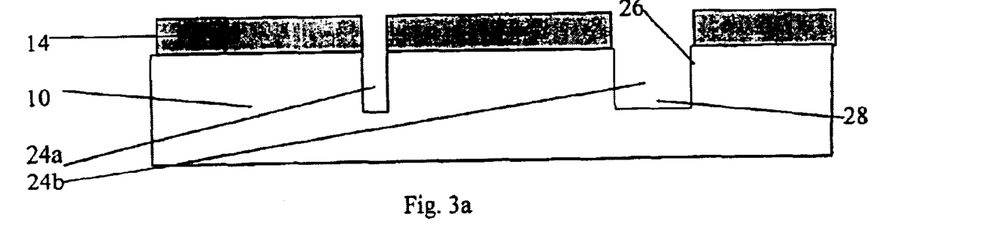
FIGS. 3a–3l are cross-sectional views of a method of the present invention to form a trench for high voltage isolation in a semiconductor substrate using much thinner insulating films with reduced number of processing steps required for the planarization of the devices.

Referring to FIG. 3a, there is shown a cross-sectional view in the first step of the method of the present invention to create a trench for high voltage isolation in a semiconductor substrate. The semiconductor substrate 10 is of single crystalline silicon. It has a first planarized surface which is covered by a layer 14 of silicon (di)oxide. The layer 14 of silicon (di)oxide can be thermally grown on the substrate, and is on the order of approximately 1000 angstroms. Using conventional photoresist and photolithographic techniques, openings 24a and 24b are created in the layer 14 of silicon (di)oxide, and the silicon (di)oxide is etched until the silicon substrate 10 is exposed. The openings 24a and 24b are positioned in locations where trenches 24a and 24b will be formed. The opening 24b of interest is on the order of 0.5 micron wide. As is well known in the art, this opening 24b needs to be wide enough so that metal line over the substrate 10 will not cause higher value inter-electrode capacitance with the substrate 10. Using the layer 14 of silicon (di)oxide as a mask trenches 24a and 24b on the order of 2000 angstroms deep are formed in the substrate 10. These trenches 24a and 24b, however, are not deep enough to provide the necessary isolation depth for high voltages. The trench 24b of interest is defined by sidewalls 26 and a bottom surface 28. The formation of the trenches 24a and 24b can be done by using conventional RIE etching of silicon and is well known in the art. The resultant structure is shown in FIG. 3a.

A layer of silicon nitride 18 is then conformally deposited to the contour of the structure shown in FIG. 3a. The silicon nitride is on the order of 1000 angstroms. The silicon nitride is then RIE anisotropically etched, leaving spacers covering the sidewalls 26 of the trench 24b. The spacers, however, cover only a portion of the bottom surface 28 of the trench 24B. A portion 30 of the bottom surface 28 remains exposed and is not covered by the silicon nitride spacers. The resultant structure is shown in FIG. 3b.

Figure 3B:
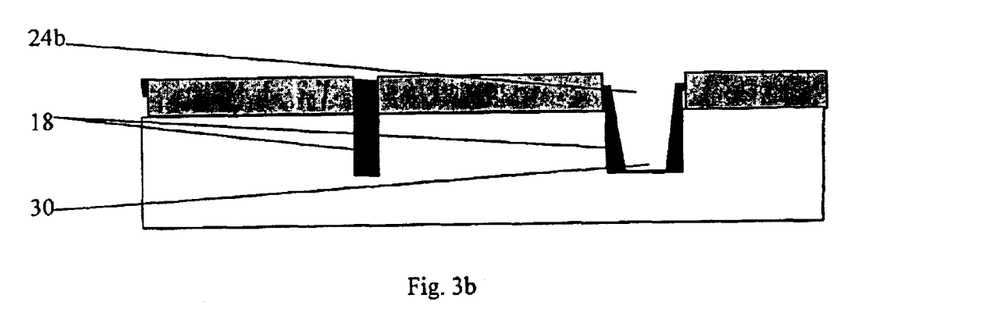
Figure 3C:
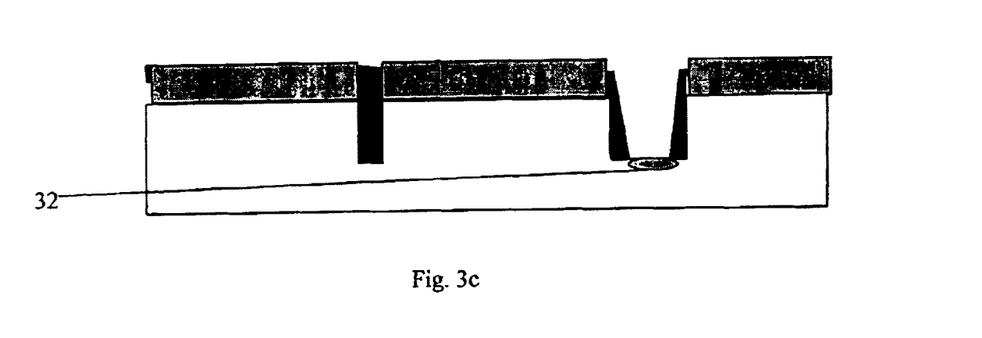

The structure shown in FIG. 3b is then oxidized. This can be done, for example, by oxidizing Si into $SiO_2$ by high temperature oxidation. This results in the exposed portion 32 of the substrate 10 being converted into silicon (di)oxide. This portion 32 is a portion of the bottom surface 28 of the trench 24b not covered by the silicon nitride spacer. The region 32 that is converted to silicon (di)oxide is along the bottom surface 28 of the trench 24b. The resultant structure is shown in FIG. 3c.

Figure 3D:
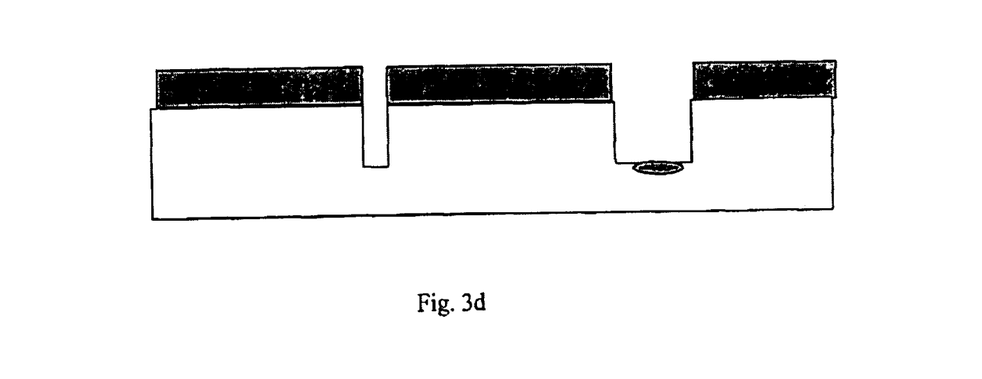

Using hot phosphoric acid as a wet etch, the silicon nitride spacers are then removed from the sidewalls 26 of the trench 24b and from the trench 24a. The resultant structure is shown in FIG. 3d.

Figure 3E:
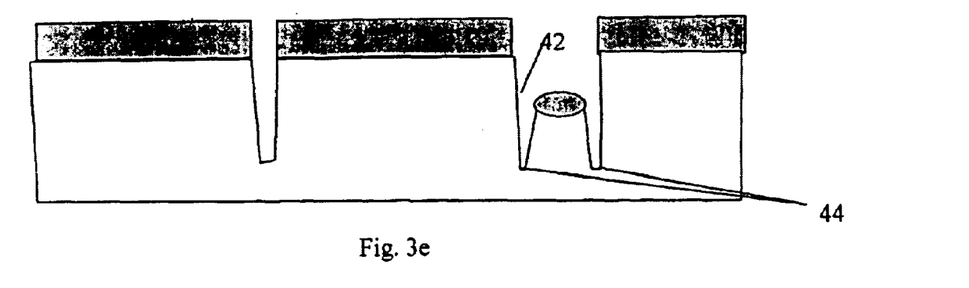

Using further silicon RIE anisotropic etch, the portion of the bottom surface 28 which is not covered by the silicon (di)oxide 32 is then further etched, creating second trenches 44. The etchant used is a compound selected from a group consisting of HBr, $SiF_4$, $Cl_2$, $Br_2$, $SiCl_4$, $Br+Cl_2$. The second trenches 44 are typically much deeper, for example, on the order of at least 1 micron deep, and similar to the first trench 24b have sidewalls and a bottom surface. The resultant structure is shown in FIG. 3e.

Figure 3F:
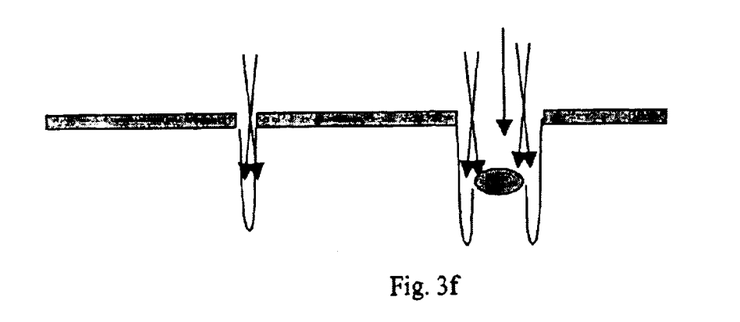

For high voltage isolation, the conductivity profile along the side walls of the first trench 24b and along the sidewalls of the second trenches 44 need to be of a certain conductivity type. This can be done by ion implanting B, AL, Ga or In species into the trench regions 24a, 24b, and 44 at 4×angled (3 to 15 degrees) to dope the sidewalls. This step is shown in FIG. 3f.

The silicon (di)oxide 14 that was initially deposited on the first surface of the silicon substrate 10 is then removed by wet chemical etches using HF acid and water or other chemicals. The resultant structure is shown in FIG. 3g.

Figure 3G:
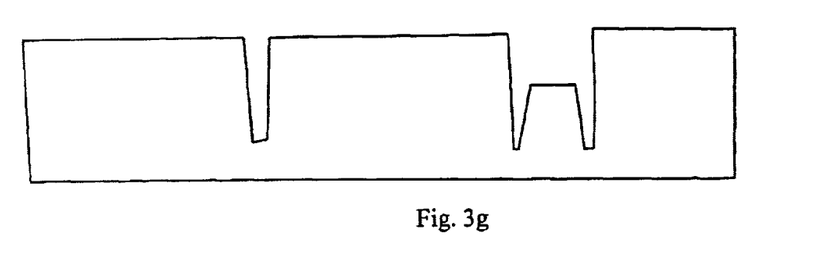

The structure shown in FIG. 3g is then subject to oxidation and all of the exposed regions of the semiconductor substrate 10 are converted to silicon (di)oxide. This forms a layer 46 of silicon (di)oxide along the top surface of the substrate 10, along the side walls and bottom surface of trenches 24a and 24b, and trench 44,. This layer is on the order of 50 angstroms in thickness. The resultant structure is shown in FIG. 3h.

Figure 3H:
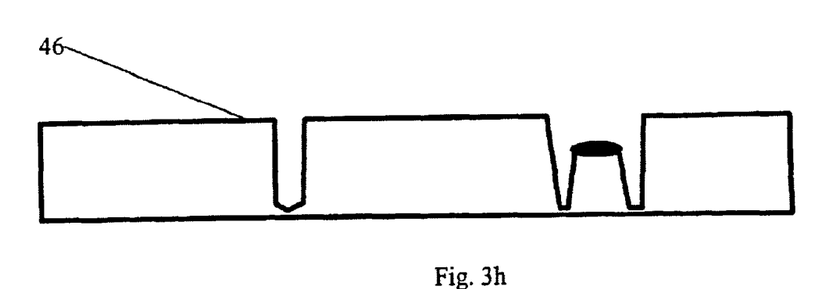
Figure 3I:
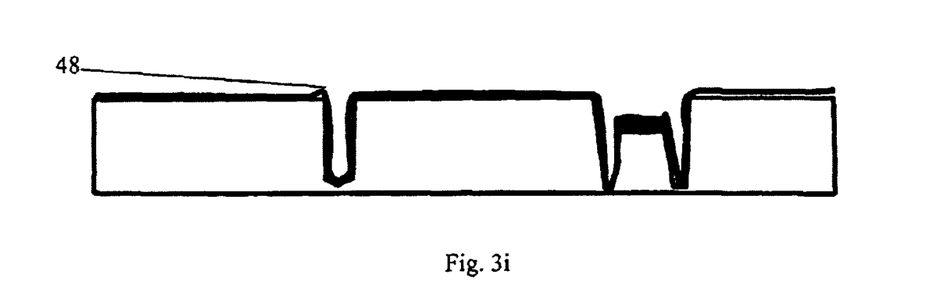

A thin layer (on the order of 50 to 100 angstroms) of silicon nitride 48 is then deposited on all the exposed regions of the structure shown in FIG. 3h. Thus, silicon nitride is deposited on the top surface of the substrate 10, within the trenches 24A and 24B and 44 along the side walls thereof and on the bottom surface thereof. The resultant structure is shown in FIG. 3i.

Finally, an insulating layer of HDP (High Density Plasma) film 50 made of silicon (di)oxide is then deposited everywhere. This includes along the top surface of the substrate 10, within the trenches 24A and 24B and within the trench 44. The insulating HDP film is deposited so that it fills the openings and conforms to the contour of the shape of the structure as shown in FIG. 3i. Although the deepest part of the trench 44 is on the order of 1.2 micron from the surface of the substrate 10, the HDP film 50 deposited need only be on the order of 2000–3000 angstroms thick, because the trench 44 is narrow, and contour deposition of HDP even at 2000–3000 angstroms thick will fill the depth of the trench 44. As a result, the opening 24b at its top surface shows some but not a great deal of variation in its contour. The resultant structure is shown in FIG. 3j.

Figure 3J:
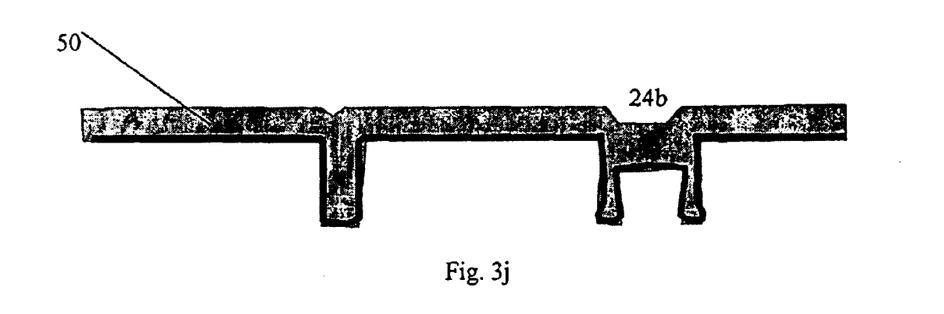

The structure shown in FIG. 3j can then be subject to planarization techniques such as CMP polishing. Because the changes in the contour along the surface of the HDP film of the structure shown in FIG. 3j is not that great, CMP polishing of the structure shown in FIG. 3j can easily be accomplished without extra masks commonly used in the industry and prior art.

Figure 3K:
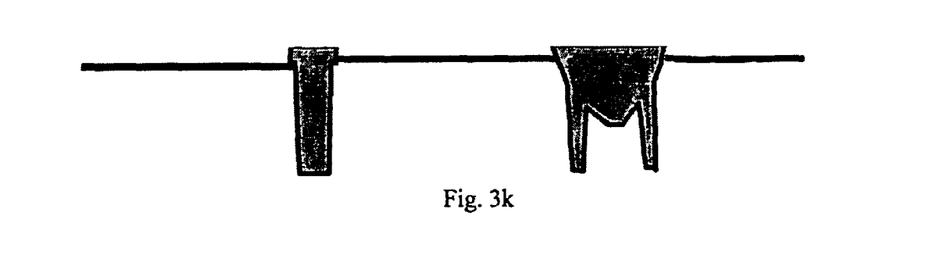

The resultant structure is shown in FIG. 3k. In CMP polishing, the layer of silicon nitride 48 is used as an etch stop.

Figure 3L:
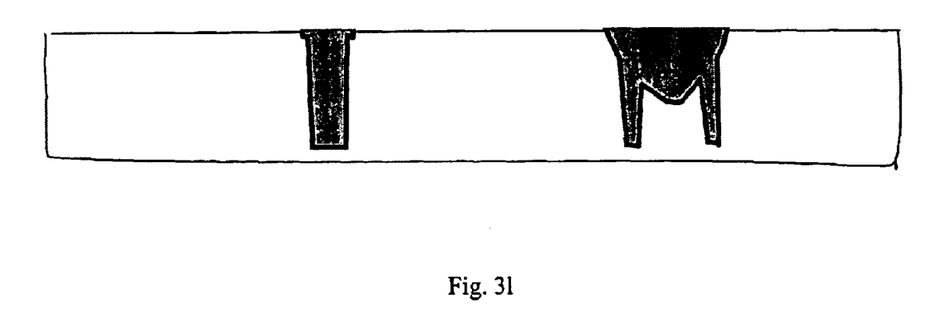

The layer of silicon nitride 48 can be then removed from the top surface of the structure from FIG. 3k. The resultant structure is shown in FIG. 3l.

Figure 4A:
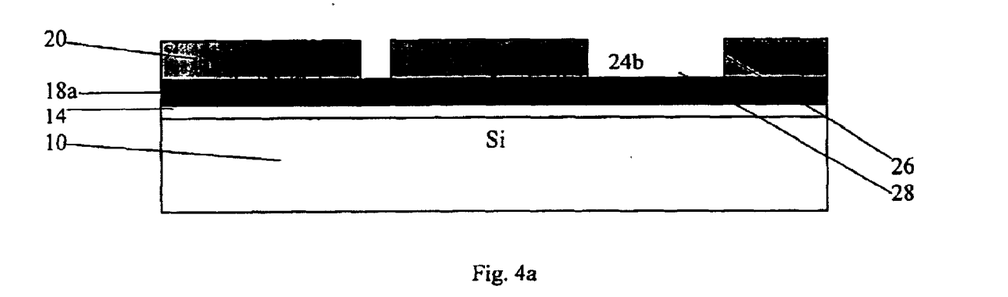
FIGS. 4a–4n are cross-sectional views of another method of the present invention to form a trench for high voltage isolation in a semiconductor substrate, in which the trench has a sublithographic opening and also uses much thinner insulating films with reduced number of processing steps required for the planarization of the devices. The wider isolation parts of the trenches have deeper edges to support higher isolation voltages.

Although the discussion heretofore has been with regarding to the formation of trenches 24a and 24b and from the drawings it appears that trench 24a is of a narrower width than trench 24b, the method of the present invention can also be used with the method disclosed in FIGS. 1 and 2 to form a high voltage trench isolation that has sublithographic dimensions. Referring to FIG. 4a, there is shown a silicon substrate 10 having a layer 14 of silicon (di)oxide thereon (which is on the order of 50 angstroms), with a first layer of silicon nitride 18a thereon (which is on the order of 300 angstroms). A layer 20 of Polysilicon (on the order of 500 angstroms) is formed on the layer 18a of silicon nitride 18a. Using photoresist and lithographic processes, as discussed heretofore, and which are well known in the art, trenches, such as 24b, having lithographic features are formed in the Polysilicon 20. The lithographic trench 24b has sidewalls 26 and bottom surface 28. The resultant structure is shown in FIG. 4a.

Figure 4B:
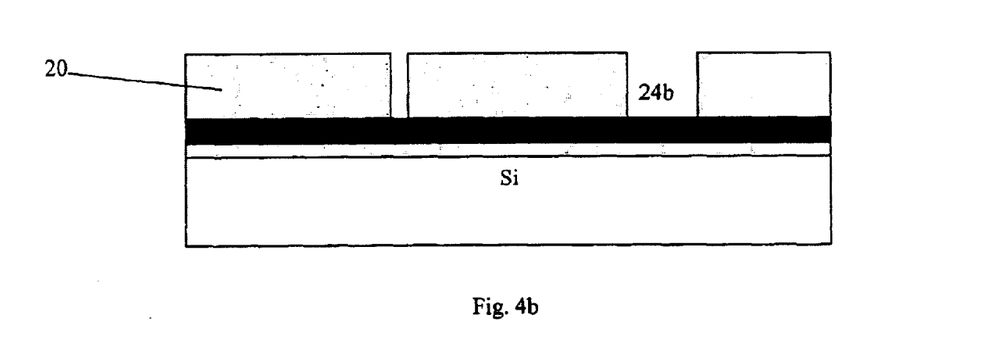

The structure shown in FIG. 4a is then oxidized similar to the description for the process shown in FIG. 1f, converting the Polysilicon 20 into silicon (di)oxide. The conversion of Polysilicon 20 into silicon (di)oxide results in a lateral expansion of the silicon dioxide to decrease the size of the opening 24b thereby creating a sublithographic opening. The conversion of Polysilicon 20 into silicon (di)oxide 20 also increases the thickness of the layer 20 to approximately 1100 angstroms. The resultant structure is shown in FIG. 4b.

With the layer 20 of silicon (di)oxide as the mask layer, the sublithographic opening 24b is used to etch the underlying layers 18a of silicon nitride and layer 14 of silicon (di)oxide. The resultant structure is shown in FIG. 4c.

Figure 4C:
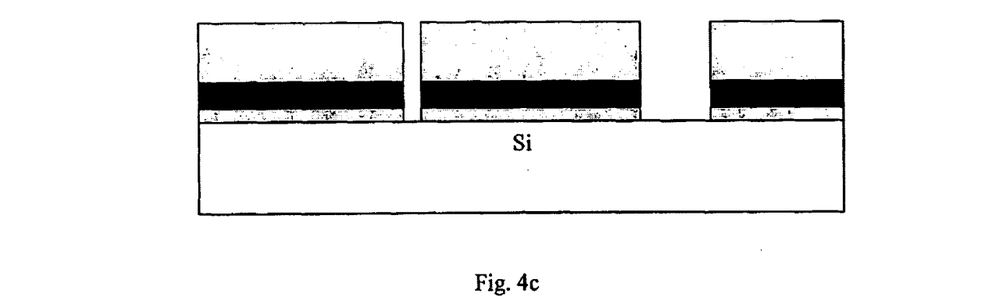

Etching then continues from the structure shown in FIG. 4c to form the sublithographic trench 24B in the substrate 10. This resulting structure is shown in FIG. 4d.

Figure 4D:
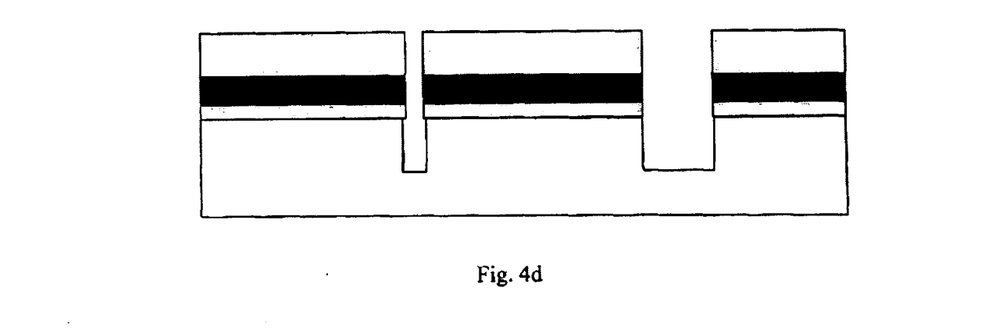
Figure 4E:
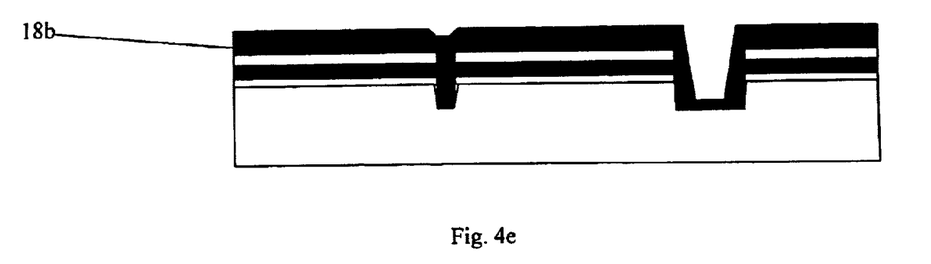

Similar to the steps and the process shown in FIG. 3b–3k, a second layer of silicon nitride 18b is then applied to deposit conformally to the structure shown in FIG. 4d. The second layer 18b of silicon nitride is deposited on the converted silicon (di)oxide 20 as well as being in the trenches 24a and 24b. The resultant structure is shown in FIG. 4e.

Figure 4F:
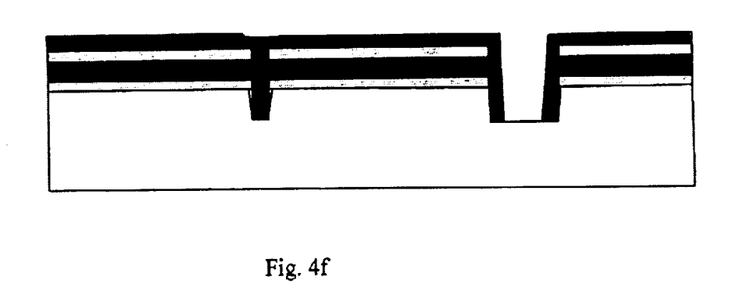

The second layer 18b of silicon nitride is then anisotropically etched resulting in spacers being formed in the bottom surface 28 of the sublithographic trench 24b. The anisotropic etch uses the single crystalline silicon as an etch stop. When single crystalline silicon is detected, the etching of silicon nitride ceases. The resultant structure is shown in FIG. 4f.

Figure 4G:
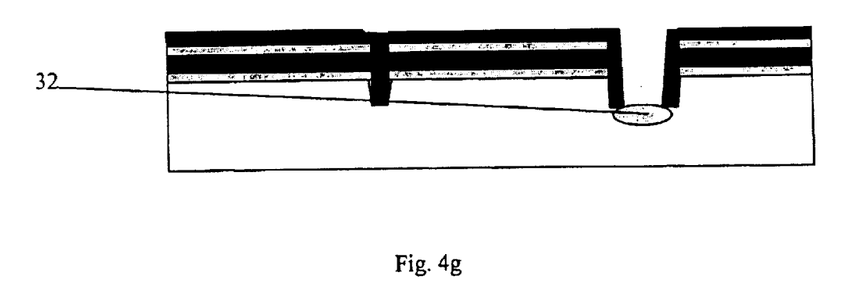

The portion of the bottom surface 28 in the trench 24B which is exposed is then oxidized, forming the region 32. The resultant structure is shown in FIG. 4g.

The second layer 18b of silicon nitride along with the silicon nitride spacer in the trench 24b are removed. This is done by wet etch process, such as by hot phosphoric acid. This also causes the removal of some of the silicon nitride of the first layer 18a. The resultant structure is shown in FIG. 4h.

Figure 4H:
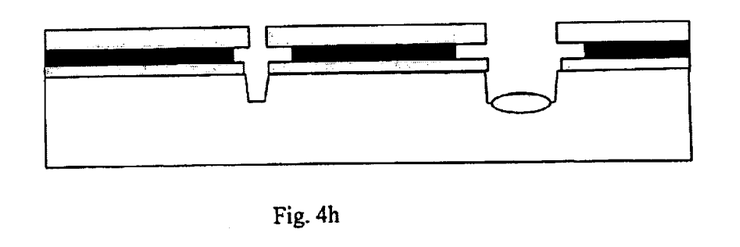
Figure 4I:
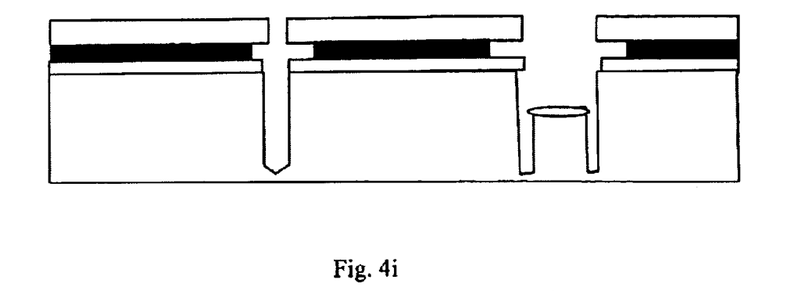

The structure shown in FIG. 4h is then subject to an etch process similar to that disclosed and shown in FIG. 3e, forming second trenches 44 that are at least 1 micron deep, using reactants such as $Cl_2$, $BCl_3$, $SiCl_2$, $NF_3$ and $H_2$, He, $N_2$ etc. The resultant structure is shown in FIG. 4i.

Figure 4J:
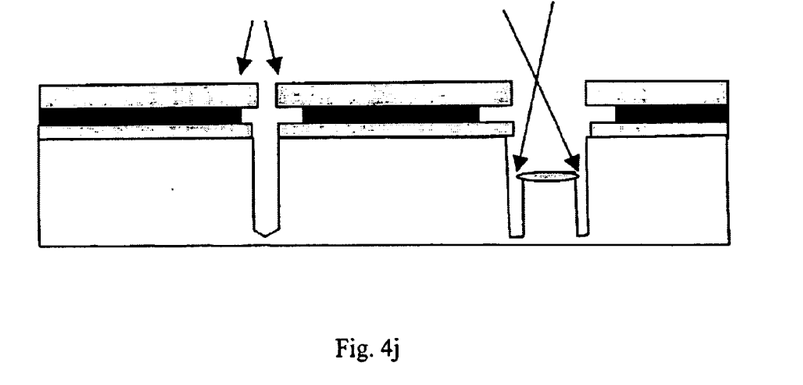

An implant step follows in which B or Al, Ga, In species are implanted along the sidewalls of the trenches 24a, 24b and 44. The resultant structure is shown in FIG. 4j.

The converted silicon (di)oxide 20, the first layer 18a of silicon nitride, and the silicon (di)oxide 14 are then removed. The structure can then be oxidized, forming silicon (di)oxide along the side walls and along the bottom surfaces of the trenches 24a, 24b and 44. Thus, the entire exposed structure of the semiconductor substrate 10 is oxidized. The resultant structure is shown in FIG. 4k.

Figure 4K:
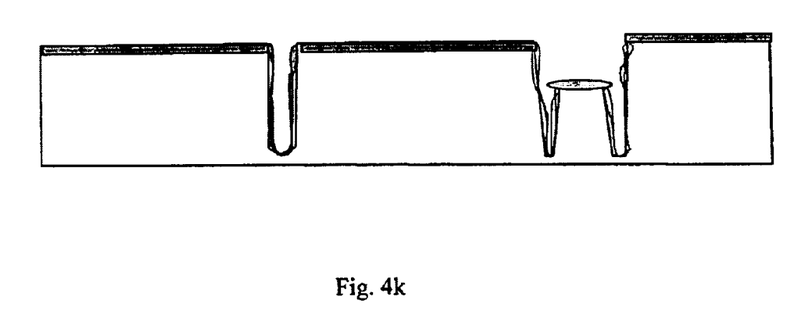
Figure 4L:
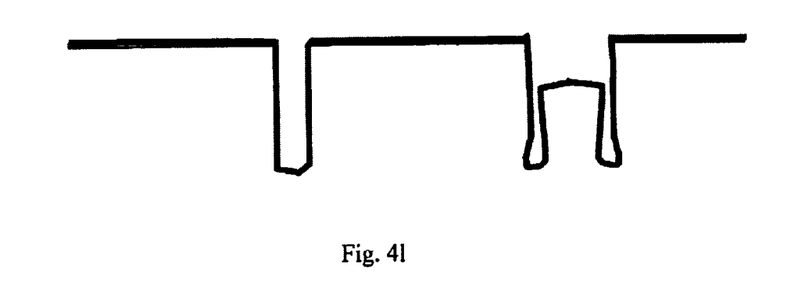

A thin layer of silicon nitride is then conformally deposited along the contour of the structure shown in FIG. 4k. The resultant structure is shown in FIG. 4l. An insulating layer of HDP film is then conformally deposited to follow the contour of the structure shown in FIG. 4l. The HDP film is along the first surface of the top surface of the silicon substrate 10 and fills the trenches 24a, 24b and 44. The resultant structure is shown in FIG. 4m.

Figure 4M:
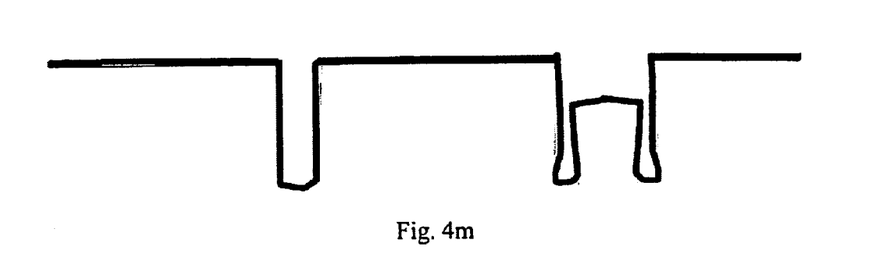
Figure 4N:
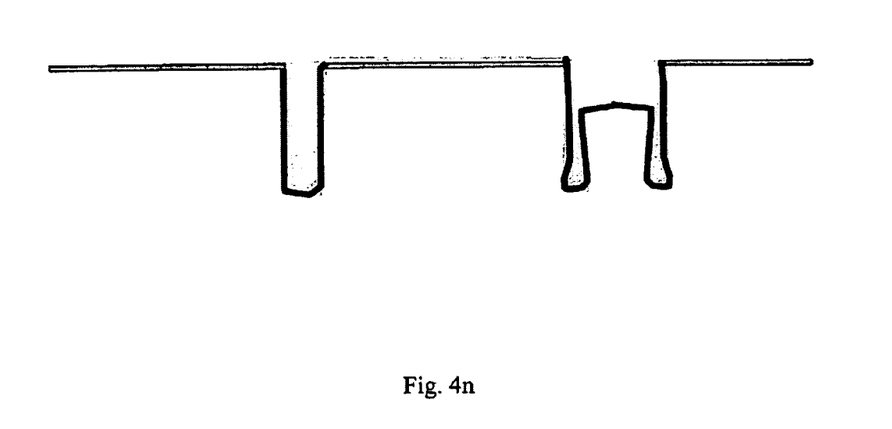

The structure shown in FIG. 4M can then be planarized using CMP polishing to form the structure shown in FIG. 4n.

Figure 5:
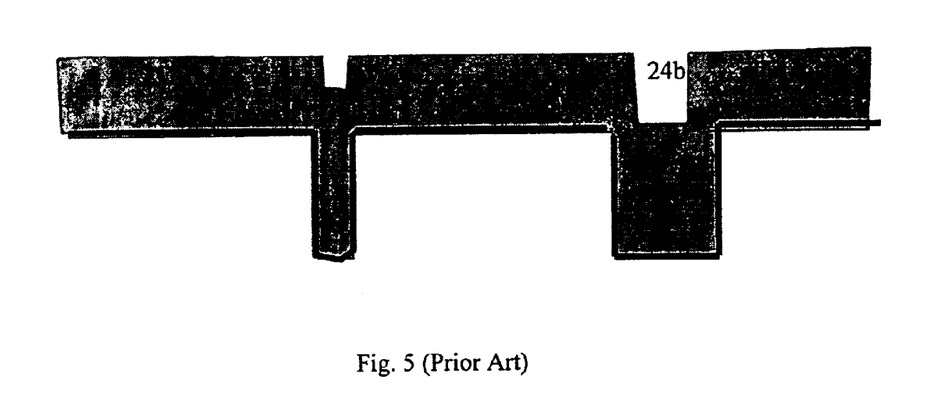
FIG. 5 is a cross-sectional view of a structure created using the method of prior art to create a trench for high voltage isolation showing the large variation in the contour on the surface of the substrate.

With the method of the present invention of forming first a shallow trench, then followed by deeper trenches, as can be seen in FIGS. 3J and 4N, when the HDP film is deposited to conform to the contours of the structure, the top surface of the HDP film, although it has some irregularities, the irregularities are not as pronounced as that of the prior art. Referring to FIG. 5, there is shown the shape of the HDP film when it is deposited using the method of the prior art. As can be seen in FIG. 5, the contour of the HDP film using the prior art method has great irregularities and such irregularities can cause severe problems in eventual CMP or planar polishing of the topmost surface. However, with the method of the present invention, as can be seen by reference to the structure shown in FIGS. 3j and 4m the contour is less irregular. Thus, CMP polishing or planar polishing is greatly facilitated.

What is claimed is:

1. A method of creating a trench for high voltage isolation in a semiconductor substrate having a first surface, said method comprising:

forming a first trench in said substrate, said first trench having sidewalls and a bottom surface with said first trench having a first width and a first depth;

forming spacers along said sidewalls of said first trench with said spacers partially covering said bottom surface;

forming a barrier layer on portions of said bottom surface not covered by said spacers;

removing said spacers thereby exposing portions of said bottom surface not covered by said barrier layer;

etching said bottom surface, not covered by said barrier layer, to form a second trench having sidewalls and a bottom surface with said second trench having a second depth; and conformally depositing an insulating layer on said first surface including filling said first and second trenches.

2. The method of claim 1 further comprising:

depositing a stopping layer on said substrate; and

CMP processing said insulating layer until said stopping layer is exposed.

3. The method of claim 1 further comprising:

implanting a dopant into the sidewalls of said first trench and second trench.

4. The method of claim 1 wherein said second depth is greater than 1.0 micron.

5. The method of claim 2 wherein the depositing comprises:

conformally depositing said stopping layer on said first surface including sidewalls and bottom surface of said first and second trenches, prior to said conformal depositing of an insulating layer step and after said etching said bottom surface step.

6. The method of claim 5 wherein said CMP processing step stops upon exposure of said stopping layer.

7. The method of claim 1 wherein said spacers are made of silicon nitride.

8. The method of claim 7 wherein said step of forming spacers comprises:

conformally depositing silicon nitride along said sidewalls and said bottom surface of said first trench;

anisotropically etching said silicon nitride to uncover portions of said substrate on said bottom surface.

9. The method of claim 8 wherein said barrier layer is made of silicon dioxide.

10. The method of claim 9 wherein said forming a barrier layer comprises:

oxidizing the uncovered portions of said substrate.

11. The method of claim 10 wherein said removing step comprises:

wet etching said spacers.

12. The method of claim 11 wherein said etching said bottom surface step comprises RIE etching of said substrate.

13. The method of claim 12 wherein said RIE etching step uses a compound selected from a group consisting of HBR, $SiF_4$, $Cl_2$, $Br_2$, $SiCl_4$, $Br+Cl_2$.

14. The method of claim 13 wherein said insulating layer is an HDP film made of at least one of silicon oxide and silicon dioxide, the HDP film having a thickness less than 3100 angstroms.

15. The method of claim 1 wherein said first width is a lithographic dimension.

16. The method of claim 11 wherein said first width is a sublithographic dimension.

17. The method of claim 16 wherein said forming a first trench step further comprising:

depositing a first layer of silicon dioxide directly on said first surface:

depositing a first layer of silicon nitride directly on said layer of silicon dioxide;

depositing a first layer of polysilicon directly on said layer of silicon nitride;

forming a lithographic opening on said first layer of polysilicon;

converting said polysilicon into silicon dioxide thereby decreasing the size of said lithographic opening to a sublithographic opening;

using said converted silicon dioxide layer as a mask to form a first trench in said substrate, said first trench having sidewalls and a bottom surface with said first trench having a first width and a first depth.

18. The method of claim 1, wherein the barrier layer is adjacent to said bottom surface.

19. The method of claim 1, wherein the spacers are formed adjacent to said sidewalls of said first trench.

20. A method of creating a trench for high voltage isolation in a semiconductor substrate having a first surface, said method comprising:

forming a first trench in said substrate, said first trench having sidewalls and a bottom surface with said first trench having a first depth;

forming spacers along said sidewalls of said first trench so that the spacers overlay a first portion of said bottom surface while keeping a second portion of said bottom surface exposed;

forming a barrier layer adjacent to the second portion of said bottom surface;

removing said spacers to expose the first portion of said bottom surface;

etching the first portion of said bottom surface to form a second trench extending into said substrate from the bottom surface; and conformally coating the first surface with an insulating material having a thickness less than 3100 angstroms, filling said first and second trenches with the insulating material.

* * * * *